(12) United States Patent
Hapke et al.

(10) Patent No.: US 8,448,008 B2
(45) Date of Patent: May 21, 2013

(54) HIGH SPEED CLOCK CONTROL

(75) Inventors: Friedrich Hapke, Winsen (DE);
Michael Wittke, Pinneberg (DE);
Sascha Ochsenknecht, Hamburg (DE);
Thomas H. Rinderknecht, Tualatin, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 360 days.

(21) Appl. No.: 12/749,093

(22) Filed: Mar. 29, 2010

(65) Prior Publication Data
US 2010/0251045 A1 Sep. 30, 2010

Related U.S. Application Data

(60) Provisional application No. 61/163,875, filed on Mar. 27, 2009.

(51) Int. Cl.
*G06F 1/00* (2006.01)
*G06F 1/04* (2006.01)
*G01D 3/00* (2006.01)

(52) U.S. Cl.
USPC ........... 713/500; 713/600; 714/724; 702/108; 702/117; 702/125

(58) Field of Classification Search
USPC ................... 714/724; 713/500, 600; 702/108, 702/117, 125
See application file for complete search history.

(56) References Cited

U.S. PATENT DOCUMENTS

| | | | | | |
|---|---|---|---|---|---|
| 5,265,102 | A | * | 11/1993 | Saito | 714/743 |
| 5,732,246 | A | * | 3/1998 | Gould et al. | 326/38 |
| 5,987,620 | A | * | 11/1999 | Tran | 713/600 |
| 6,963,229 | B2 | * | 11/2005 | Lin | 327/33 |
| 2009/0113230 | A1 | * | 4/2009 | Ito et al. | 713/500 |

* cited by examiner

*Primary Examiner* — Mark Connolly

(57) ABSTRACT

On-chip high speed clock control techniques for testing circuits with multiple clock systems are disclosed. The techniques allow certain (e.g. compatible) high speed clocks to be activated with predefined waveforms during a capture period of a logic test, based on a clock control signal. The clock control signal may be supplied via a JTAG control port or via a scan chain load port. The clock control signal may also be generated by a BIST controller. The techniques may ensure glitch-free transitions from slow speed clocks during a shift period to fast speed clocks during a capture period.

8 Claims, 5 Drawing Sheets

HIGH SPEED CLOCK CONTROL

RELATED APPLICATIONS

This application claims priority to U.S. Provisional Patent Application No. 61/163,875, entitled "High Speed Clock Control," filed on Mar. 27, 2009, and naming Friedrich Hapke, et al. as inventors, which application is incorporated entirely herein by reference.

FIELD OF THE INVENTION

The present invention is directed to testing integrated circuits (ICs). Various aspects of the invention may be particularly useful for testing ICs with multiple high speed clock systems.

BACKGROUND OF THE INVENTION

Today, the logic self-test of ICs with high-speed clocks is mainly performed by using slow speed synchronized clocks. This means that a common test clock is used for all clock systems existed on an IC. Typically, this common test clock is derived from the JTAG (Joint Test Action Group) clock named TCK. (JTAG is the common name for what was later standardized as the IEEE 1149.1 Standard Test Access Port and Boundary-Scan Architecture). The use of a common test clock is satisfactory for testing e.g., "stuck-at" faults, but it is not sufficient for testing "open" faults or "path-delay" faults. The latter category of faults requires at least two high-speed clocks during the capture phase (or capture cycles or periods) of a logic test. Thus, the use of a common test clock is not suitable for many applications. Some conventional technologies activate all high speed clocks during the capture phase. While it may detect "open" and "path-delay" faults, this approach can lead to unexplainable values being captured if interferences exist between some of the high speed clock systems.

Some other conventional technologies activate one high speed clock at a time to avoid the interferences between different clock systems. The test time for this approach, however, is unnecessarily long. Moreover, the fault coverage is low due to the use of a single clock as explained above. Still some other conventional technologies may allow multiple different clock frequencies activated during a test, but these different clock frequencies must be a multiple of a single high speed clock, which limits their applications. In addition, conventional technologies lack on-chip hardware that supports a glitch free switching from slow speed clocks during the shift phase to high speed clocks during the capture phase.

BRIEF SUMMARY OF THE INVENTION

Aspects of the invention relate to testing integrated circuits. According to various embodiments of the invention, a high speed clock control (HSCC) circuit may, based on a clock control signal, activate certain high speed clocks with predefined waveforms during a capture period of a logic test. The clock control signal may be supplied via a JTAG control port during a BIST initialization phase or via a scan chain load port during the shift operation. The clock control signal may also be generated based on a selection signal from the BIST controller such that the generated clock waveforms can be easily reconfigured via an Engineering Change Order (ECO) that may occur late in the design cycle. The HSCC circuit may ensure glitch-free transitions from slow speed clocks during a shift mode to fast speed capture clocks.

DETAILED DESCRIPTION OF THE INVENTION

Various aspects of the present invention relate to testing ICs. In particular, an on-chip HSCC circuit is disclosed. In the following description, numerous details are set forth for purpose of explanation. However, one of ordinary skill in the art will realize that the invention may be practiced without the use of these specific details. In other instances, well-known features have not been described in details to avoid obscuring the present invention. Some of the disclosed techniques may be implemented as part of an electronic design automation (EDA) tool.

Figure 1:
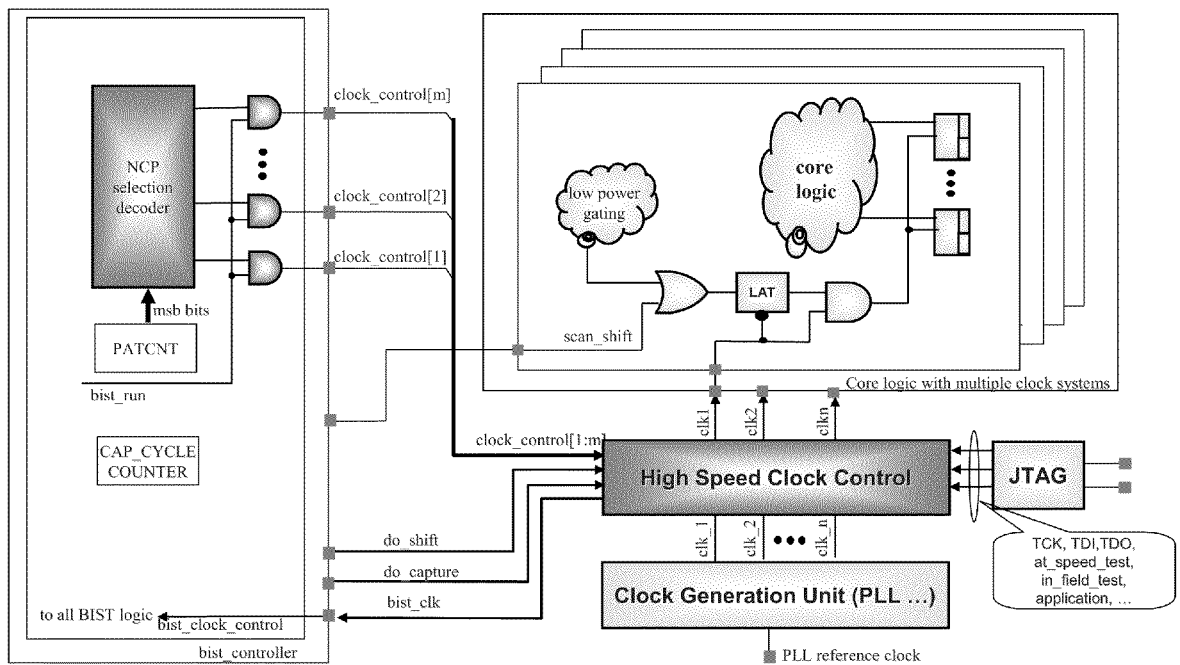
FIG. 1 illustrates a block diagram of an IC with an HSCC circuit in accordance with various embodiments of the invention.

FIG. 1 shows a block diagram of an IC with an HSCC circuit in accordance with various embodiments of the invention. The HSCC circuit is placed between a clock generation unit (CGU) and the core logic circuit to be tested. The CGU is used for application functions of the IC, and typically contains one or more PLLs (phase locked loops) and some clock dividers. The clock control part of the HSCC block is only active during a test of the IC. In the application mode, it is bypassed such that the clock paths are not affected by the HSCC circuit.

The HSCC circuit has a plurality of clock outputs, most of which are connected to the core logic circuit. A clock output, named "bist_clk," is connected to a LBIST (logic built-in self-test) controller. The control inputs of the HSCC block are driven mainly by a JTAG controller and the LBIST controller. Some of these control inputs from the JTAG controller are used to control whether an in-field test, an at-speed test, or a slow speed test is to be executed, or whether the core logic circuit is running in the application mode. The control input signal TDI ("jtag_in" in FIG. 2) from the JTAG controller may be used to activate certain clock signals with predefined waveforms. For example, only compatible clock signals may be activated during a capture cycle. As discussed in the background section, some clock systems may interfere with others, causing unexplainable values being captured during a test. These clock signals are considered to be incompatible and will not be activated in the same capture period for some tests.

The control signals from the LBIST controller are named "do_capture," "do_shift," and "clock_control[1:m]," respectively. The first two are single-bit controls while the last one is an m-bit control. The control signals "do_capture" and "do_shift" are used to control whether shift clocks or capture clocks are generated by the HSCC block. The m-bit "clock_control" signal may be used to control the HSCC block such that only certain (e.g. compatible) clocks with predefined waveforms are generated during a capture period. Here "m" represents the number of different waveform combinations. In different capture periods, the HSCC block may generate different waveform combinations. In the following description, it is assumed for simplicity that only one clock_control signal is needed, but a coded control with the one out of m decoder bits within the HSCC block would be possible as well. The most significant bits of the LBIST pattern counter (PATCNT) are used to decode which control signal shall be active for a user-defined range of LBIST patterns.

Figure 2:
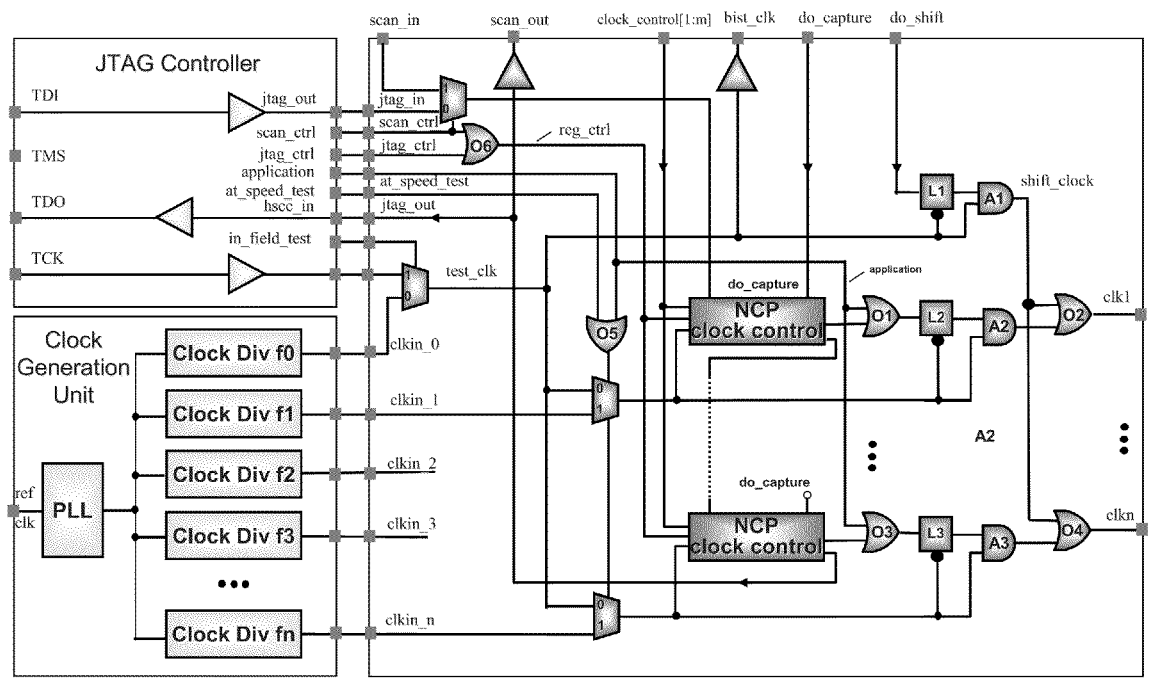
FIG. 2 illustrates a block diagram of the HSCC circuit with the JTAG controller and the CGU (clock generation unit) according to various embodiments of the invention.

FIG. 2 shows a block diagram of the HSCC circuit according to various embodiments of the invention. For each clock system (or clock frequency), the illustrated HSCC circuit contains essentially the same logic which includes, among others, an NCP (named capture procedure) clock control circuit and a glitch-eliminating circuit. The NCP clock control circuit may contain the ECO, JTAG and SCAN programmable circuits which can be used to generated high speed clock waveforms according to either an NCP selected by the clock_control[1:m] or the jtag_in/scan_in control signals. The two control signals from the JTAG controller, jtag_ctrl and scan_ctrl, determine which one of the clock_control[1:m], jtag_in, or scan_in control signals will be used by the NCP clock control circuit.

The clock inputs named "clkin_1" to "clkin_n" are the high speed application clocks coming from the CGU. These application clocks are typically derived from one or more free running PLLs. The clock input named "clkin_0" is used to derive the needed slow running internal clock named "test_clk." The "test_clk" is used to generate the "bist_clk" and the "shift_clock." The "bist_clk" is the clock signal that clocks the LBIST controller.

The AND gate (A1) and the latch (L1) with the signal "do_shift" as input to the latch L1 are used to create glitch free slow running clocks (clk1 to clkn) during a shift operation of the LBIST. The AND gate (A2) and the latch (L2) with an OR gate (O1) in front of the latch (L2) are used to generate the glitch free high speed running clock (clk1) during a capture operation of the LBIST. The AND gate (A3) and the latch (L3) with an OR gate (O3) in front of the latch (L3) are used to generate the glitch free high speed running clock (clkn) during a capture operation of the LBIST. The high speed clocks are controlled via the NCP clock control circuit. The slow speed clocks for the shift operation and the high speed clocks for the capture operation are combined together by a series of OR gates (e.g. O2 and O4). As discussed before, the control signals, "do_capture" and "do_shift" from the LBIST controller, determine the mode (shift operation v. capture operation) of the HSCC circuit's clock outputs.

In addition to jtag_in, jtag_ctrl and scan_ctrl, three other control signals, "application," "at_speed_test," and "in_field_test," are supplied by the JTAG controller. The control signal "application" is active (i.e. at the state of "1") during the application of the IC and ensures continuously running high speed clocks. The control signal "at_speed_test" is used to switch between high speed and slow speed capture clocks. The control signal "in_field_test" is used to define if an LBIST is to be executed in the field (within the application system) or as a production test.

Figure 3:
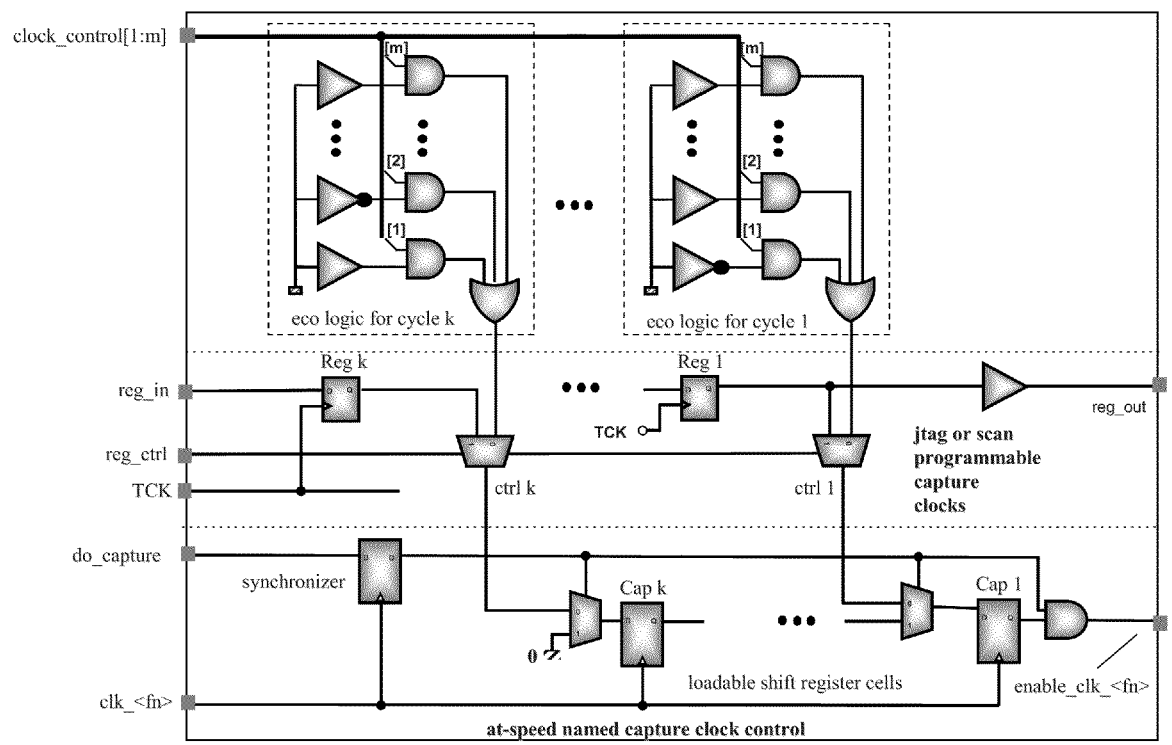
FIG. 3 illustrates an example of the NCP clock control circuit.

An example of the NCP clock control circuit is shown in FIG. 3. The registers named Cap 1 to Cap k are used to create high speed enabling signals for the high speed clocks desired during a capture period. These registers are clocked with their corresponding high speed clock named "clk_<fn>." Depending on the static control data that is provided via the multiplexers (ctrl 1 to ctrl k), the registers Cap 1 to Cap k will produce a maximum of k clock enabling pulses, after the synchronized "do_capture" signal changes from low to high. The control data can be programmed during an initialization phase (before the do_capture signal goes high). This programming can be done via JTAG control (when the control signal jtag_ctrl is high), during an LBIST initialization phase, or even via scan loads (scan_in) during the shift operation of every pattern before the capture cycles start. Furthermore, the programming of the desired capture cycles can also be done without any upfront initialization, but by using the "ECO logic" which is shown at the top of FIG. 3. This logic is enabled when the control signal reg_ctrl is low. Here, the reg_ctrl is the output of an OR gate (OR 6 in FIG. 2) and is low only when both the control signals jtag_ctrl and scan_ctrl are low. The input reg_in is either scan_in or jtag_in depending on scan_ctrl.

This ECO logic can be programmed at a very late design phase, by using a buffer instead of an inverter or vice versa. Also, connections to vdd or vss can be used to program the ECO logic as needed. Furthermore, this ECO logic can also be implemented by electrical fuses (E-Fuses) which can be programmed even after tapeout, e.g., during the production test. The m-bit control signal "clock_control[1:m]" can be used to select which clock control combination (that is, which NCP) shall be activated. Each NCP can be activated for a certain amount of test patterns. The control signals can either be defined by the LBIST controller or via IC pins from the test system.

Figure 4:
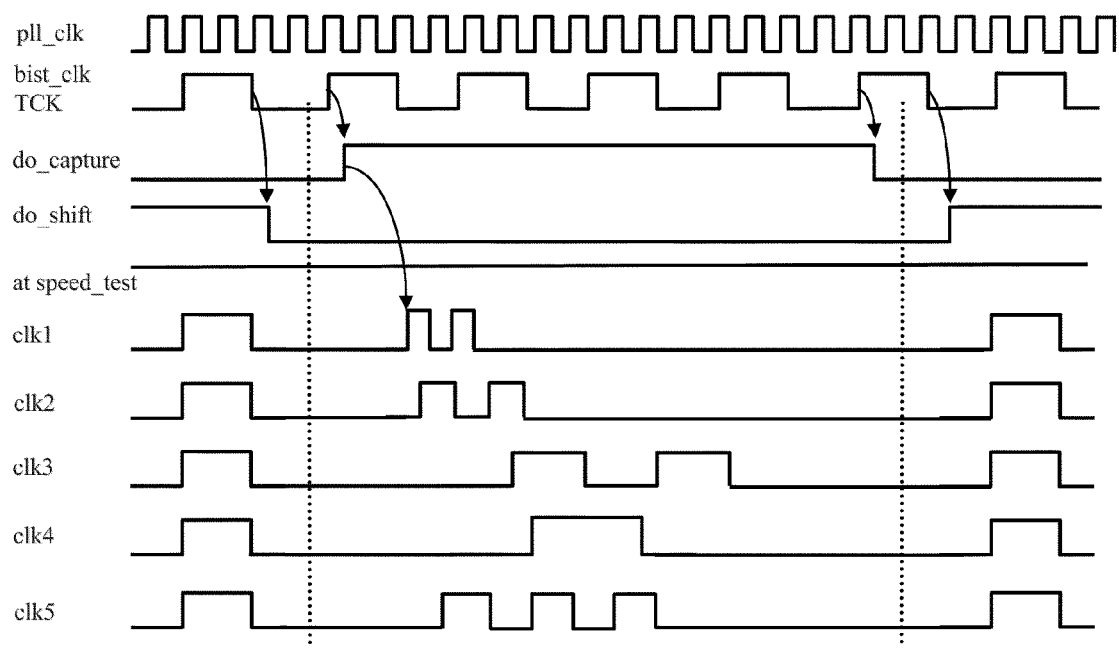
FIG. 4 illustrates an example of high speed capture waveforms generated by an HSCC circuit in accordance with various embodiments of the invention.

FIG. 4 shows a waveform diagram of high speed capture waveforms generated according to various examples of the invention. For this example, it is assumed that the clock named "pll_clk" is the free running clock generated at the output of a certain PLL (phase looked loop). It is further assumed that a second, slower clock is used and that typically this shall be the JTAG clock named TCK. This TCK clock is used as the clock for the LBIST controller, and is named "bist_clk". The control signal "do_capture" is used to start and end a capture period, while the control signal "do_shift" is used to start and end a shift period. These two control signals typically are never active at the same time, i.e. there shall typically be no overlapping time between them for at least half a clock period of TCK. The control signal "at_speed_test," however, is high all the time for the high speed capture operation. The clock signals "clk1" to "clk5" are the clock signal outputs of the HSCC circuit, and are connected to the core logic circuit to be tested. These clock signals can be fully controlled according to various examples of the invention.

During a shift period (when "do_shift" is active and "do_capture" is low), the slow TCK clock is used to create the slow and in sync running clock for "clk1" to "clk5". To create high speed and free running capture clocks for "clk1" to "clk5" during a capture period, the NCP clock control hardware as shown in FIG. 3 uses a three bit long register (Cap 1 to Cap 3). This allows for creating a maximum of 3 clock pulses (e.g. clk5 has three clock pulses during the capture period in FIG. 4).

The programming for the 5 clocks is shown in Table 1. For "clk1" only the first and the second high speed clock pulse is wanted, therefore Cap1=1, Cap2=1 and Cap3=0. For "clk4" only the first clock pulse is wanted, therefore Cap1=1, Cap2=0 and Cap3=0. Every clock pulse can be programmed to be activated or disabled. Therefore, all possible and needed high speed waveforms may be created according to various examples of the invention.

TABLE 1

|       | Cap 3 | Cap 2 | Cap 1 |
|-------|-------|-------|-------|
| clk 1 | 0     | 1     | 1     |
| clk 2 | 0     | 1     | 1     |
| clk 3 | 0     | 1     | 1     |
| clk 4 | 0     | 0     | 1     |
| clk 5 | 1     | 1     | 1     |

Figure 5:
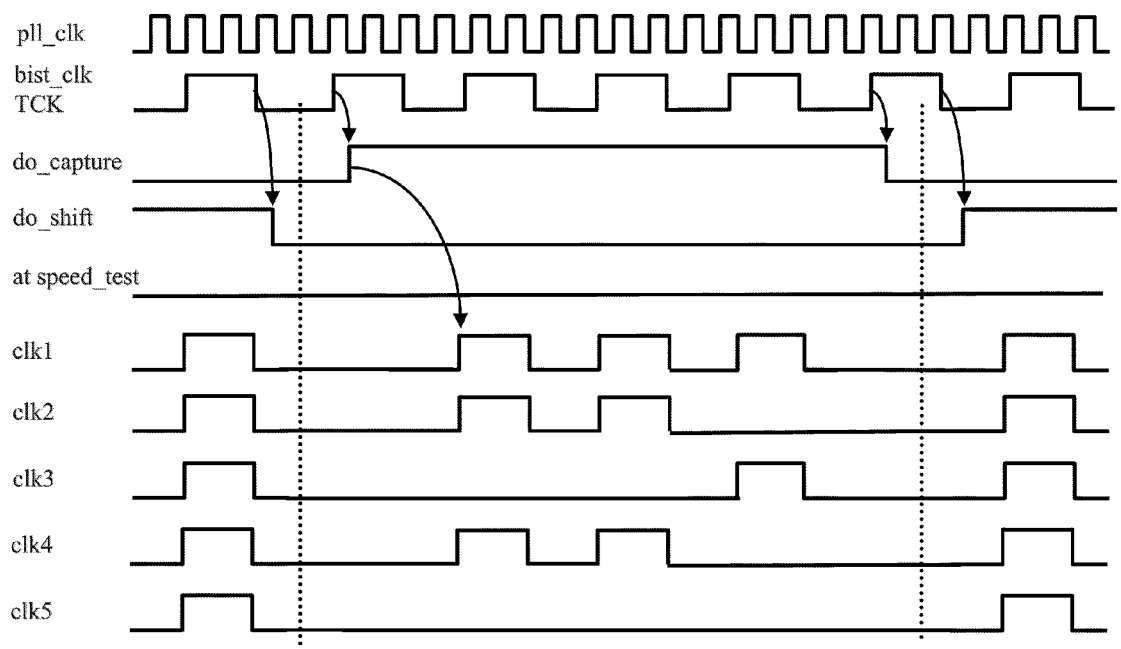
FIG. 5 illustrates an example of slow speed capture waveforms generated by an HSCC circuit in accordance with various embodiments of the invention.

The waveform diagram in FIG. 5 is an example to show which kind of slow speed capture waveforms can be generated according to various examples of the invention. Those slow speed capture waveforms are needed, for example, for "stuck_at" tests. Here, it is assumed that the clock named "pll_clk" is the free running clock generated at the output of a certain PLL (Phase Looked Loop). It is further assumed that a second, slower clock is used and that typically this shall be the JTAG clock named TCK. This TCK clock is used as the clock for the LBIST controller, and is named "bist_clk". The control signal "do_capture" is used to start and end the capture period, while the control signal "do_shift" is used to start and end the shift period. These two control signals are typically not active at the same time, i.e. there typically is no overlapping time between them for at least half a clock period of TCK. The control signal "at_speed_test," however, is low all of the time for the low speed capture operation. The clock signals "clk1" to "clk5" shall be the clock signal outputs of the HSCC circuit and are connected to the core logic circuit to be tested. These clock signals can be fully controlled according to various examples of the invention.

During a shift period (when "do_shift" is active and "do_capture" is low), the slow TCK clock is used to create the slow and in sync running clocks "clk1" to "clk5". To create the slow speed capture clocks "clk1" to "clk5" during a capture period, the NCP clock control hardware as shown in FIG. 3 uses a three bit long register (Cap1 to Cap3). This allows for creating a maximum of 3 clock pulses. Here, "clk1" has three clock pulses. The programming for the 5 clocks is as shown in Table 2. For "clk1" all three clock pulses are wanted, therefore Cap1=1, Cap2=1 and Cap3=1. For "clk3", only the third clock pulse is wanted, therefore Cap1=0, Cap2=0 and Cap3=1. As before, every clock pulse can be programmed to be activated or disabled. Therefore, all possible and needed high speed waveforms may be created according to various examples of the invention.

TABLE 2

|       | Cap 3 | Cap 2 | Cap 1 |
|-------|-------|-------|-------|
| clk 1 | 1     | 1     | 1     |
| clk 2 | 0     | 1     | 1     |
| clk 3 | 1     | 0     | 0     |
| clk 4 | 0     | 1     | 1     |
| clk 5 | 0     | 0     | 0     |

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, the HSCC circuit described above can control high speed clocks in a capture period in three different ways, it should be appreciated that various embodiments of the invention may be implemented by using any desired combination of them.

What is claimed is:

1. An integrated circuit for clock control, comprising:
   a glitch-elimination module that generates a first glitch-free clock waveform for clock systems of a core logic circuit in a shift operation of a logic test of the core logic circuit; and
   a plurality of clock control modules that generate a plurality of glitch-free clock waveforms for the clock systems of the core logic circuit in a capture operation of the logic test of the core logic circuit, each of the plurality of clock control modules including:
      a clock control sub-module that generates clock enabling pulses based on a clock control signal and a clock signal;
      a glitch-elimination sub-module that generates, based on the clock enabling pulses, a second glitch-free clock waveform with 0 to k pulses for one of the clock systems of the core logic circuit in the capture operation; and
      a combination sub-module that combines the first glitch-free clock waveform and the second glitch-free clock waveform with 0 to k pulses.

2. The integrated circuit recited in claim 1, wherein the clock control sub-module comprises:
   a plurality of register units being connected in series, each of the register units including a 2-to-1 multiplexer and a register, an input of the register being connected to an output of the 2-to-1 multiplexer of the same register unit, an output of the register being connected to a first input of a 2-to-1 multiplexer of a next register unit in the series, a second input of the 2-to-1 multiplexer being a signal that is derived from the clock control signal, and the register being clocked with the clock signal; for the first register unit in the series, a first input of a 2-to-1 multiplexer being grounded; for the last register unit in the series, an output of a register being connected to a first input of an AND gate, a second input of the AND gate being a do-capture control signal.

3. The integrated circuit in claim 2, wherein the clock control sub-module further comprises:
   a plurality of 2-to-1 multiplexers, a first input of each of the 2-to-1 multiplexers being connected to an output of an ECO (engineering change orders) logic unit, a second input of the each of the 2-to-1 multiplexers being either a jtag_in signal or a scan_in signal determined by a scan_ctrl signal, an output of the each of the 2-to-1 multiplexers being connected to the second input of a 2-to-1 multiplexer in one of the plurality of register units, an select input of the each of the 2-to-1 multiplexers being the jtag_ctrl signal.

4. The integrated circuit recited in claim 1, wherein the clock control signals is a jtag_in signal.

5. The integrated circuit recited in claim 1, wherein the clock control signals is a scan_in signal.

6. The integrated circuit recited in claim 1, wherein the clock control signals is a clock_control[1:m] signal.

7. The integrated circuit recited in claim 1, wherein the combination sub-module is an OR gate.

8. The integrated circuit recited in claim 1, further comprising a means for allowing a clock signal to bypass the integrated circuit.

* * * * *